(12) United States Patent
Creyghton et al.

(10) Patent No.: US 11,352,696 B2
(45) Date of Patent: Jun. 7, 2022

(54) PLASMA SOURCE AND SURFACE TREATMENT METHOD

(71) Applicant: Nederlandse Organisatie voor toegepast-natuurwetenschappelijk onderzoek TNO, 's-Gravenhage (NL)

(72) Inventors: Yves Lodewijk Maria Creyghton, 's-Gravenhage (NL); Paulus Willibrordus George Poodt, 's-Gravenhage (NL); Marcel Simor, 's-Gravenhage (NL); Freddy Roozeboom, 's-Gravenhage (NL)

(73) Assignee: NEDERLANDSE ORGANISATIE VOOR TOEGEPAST— NATUURWETENSCHAPPELIJK ONDERZOEK TNO, 'S-Gravenhage (NL)

( * ) Notice: Subject to any disclaimer, the term of this patent is extended or adjusted under 35 U.S.C. 154(b) by 0 days.

(21) Appl. No.: 15/321,847

(22) PCT Filed: Jun. 25, 2015

(86) PCT No.: PCT/NL2015/050463
§ 371 (c)(1),
(2) Date: Dec. 23, 2016

(87) PCT Pub. No.: WO2015/199539
PCT Pub. Date: Dec. 30, 2015

(65) Prior Publication Data
US 2017/0137939 A1 May 18, 2017

(30) Foreign Application Priority Data

Jun. 25, 2014 (EP) ..................................... 14173878

(51) Int. Cl.
*C23C 16/455* (2006.01)
*H01J 37/32* (2006.01)
(Continued)

(52) U.S. Cl.
CPC .... *C23C 16/45514* (2013.01); *C23C 16/4583* (2013.01); *C23C 16/45504* (2013.01);
(Continued)

(58) Field of Classification Search
CPC .......... H01J 37/32825; H01J 37/32348; H01J 37/3244; H01J 37/32715; H01J 37/32568;
(Continued)

(56) References Cited

U.S. PATENT DOCUMENTS 5,893,985 A * 4/1999 Luo ........................ B23K 10/00
219/121.48
6,146,503 A * 11/2000 Sindzingre .............. B29C 59/12
204/164

(Continued)

FOREIGN PATENT DOCUMENTS

CN 102859647 A 1/2013
EP 2362411 A1 8/2011
(Continued)

OTHER PUBLICATIONS

JP-2005108482-A Takashima English Machine Translation retrieved from Espacenet Jul. 11, 2018 (Year: 2005).*
(Continued)

*Primary Examiner* — Ram N Kackar
*Assistant Examiner* — Laureen Chan
(74) *Attorney, Agent, or Firm* — Hoffmann & Baron, LLP

(57) ABSTRACT

A plasma source has an outer surface, interrupted by an aperture for delivering an atmospheric plasma from the outer surface. A transport mechanism transports a substrate in
(Continued)

parallel with the outer surface, closely to the outer surface, so that gas from the atmospheric plasma may form a gas bearing between the outer surface the and the substrate. A first electrode of the plasma source has a first and second surface extending from an edge of the first electrode that runs along the aperture. The first surface defines the outer surface on a first side of the aperture. The distance between the first and second surface increasing with distance from the edge. A second electrode covered at least partly by a dielectric layer is provided with the dielectric layer facing the second surface of the first electrode, substantially in parallel with the second surface of the first electrode, leaving a plasma initiation space on said first side of the aperture, between the surface of the dielectric layer and the second surface of the first electrode. A gas inlet feeds into the plasma initiation space to provide gas flow from the gas inlet to the aperture through the plasma initiation space. Atmospheric plasma initiated in the plasma initiation space flows to the aperture, from which it leaves to react with the surface of the substrate.

15 Claims, 4 Drawing Sheets

(51) Int. Cl.
| | | |
|---|---|---|
| H05H 1/24 | (2006.01) | |
| C23C 16/509 | (2006.01) | |
| C23C 16/513 | (2006.01) | |
| C23C 16/458 | (2006.01) | |

(52) U.S. Cl.
CPC ...... *C23C 16/45536* (2013.01); *C23C 16/509* (2013.01); *C23C 16/513* (2013.01); *H01J 37/3244* (2013.01); *H01J 37/32348* (2013.01); *H01J 37/32366* (2013.01); *H01J 37/32541* (2013.01); *H01J 37/32568* (2013.01); *H01J 37/32715* (2013.01); *H01J 37/32825* (2013.01); *H05H 1/2406* (2013.01); *H01J 2237/332* (2013.01)

(58) Field of Classification Search
CPC ........... H01J 37/32541; H01J 37/32366; H01J 2237/332; C23C 16/45587; C23C 16/45591; C23C 16/45595; C23C 16/45514; C23C 16/509; C23C 16/45536; C23C 16/4583; C23C 16/45504; C23C 16/513; H05H 1/2406; H05H 2001/2412; H05H 2001/2418; H05H 2001/2425; H05H 2001/2431; H05H 2001/2437; H05H 2001/2443; H05H 2001/245; H05H 2001/2446; H05H 2001/2462; H05H 2001/2468

See application file for complete search history.

(56) References Cited

U.S. PATENT DOCUMENTS

| | | | |
|---|---|---|---|
| 8,328,982 B1 | 12/2012 | Babayan et al. | |
| 2005/0016456 A1* | 1/2005 | Taguchi | H05H 1/2406 118/723 E |
| 2006/0040067 A1* | 2/2006 | Culp | C23C 16/407 427/569 |
| 2006/0185594 A1* | 8/2006 | Uehara | H01J 37/32541 118/723 E |
| 2007/0119828 A1* | 5/2007 | Kondo | B01J 19/088 219/121.52 |
| 2009/0121637 A1* | 5/2009 | Laroussi | H05H 1/2406 315/111.21 |
| 2009/0288602 A1* | 11/2009 | Satake | C23C 16/4412 118/723 E |
| 2011/0005681 A1* | 1/2011 | Savas | C23C 16/24 156/345.33 |
| 2012/0325777 A1* | 12/2012 | Okumura | H05H 1/30 216/68 |
| 2013/0012029 A1* | 1/2013 | Vermeer | C23C 16/0245 438/758 |
| 2013/0043212 A1* | 2/2013 | De Graaf | C23C 16/04 216/67 |
| 2013/0118895 A1* | 5/2013 | Roozeboom | C23C 16/0245 204/192.34 |
| 2014/0027411 A1 | 1/2014 | Voronin et al. | |
| 2015/0170924 A1* | 6/2015 | Nguyen | H01J 37/3244 438/710 |

FOREIGN PATENT DOCUMENTS

| | | | | |
|---|---|---|---|---|
| EP | 2666544 A1 | | 11/2013 | |
| JP | 2000282243 A | | 10/2000 | |
| JP | 2002018276 | | 1/2002 | |
| JP | 2002158219 A | | 5/2002 | |
| JP | 2002158219 A | * | 5/2002 | |
| JP | 2004127853 A | * | 4/2004 | |
| JP | 2005108482 A | * | 4/2005 | |
| JP | 2007042503 A | * | 2/2007 | |
| JP | 2008218254 A | * | 9/2008 | |
| JP | 2008257920 A | * | 10/2008 | |
| JP | 2008277774 A | * | 11/2008 | |
| TW | 200714138 A | | 4/2007 | |
| TW | 200915930 A | | 4/2009 | |
| TW | 200934309 A | | 8/2009 | |
| TW | 201244807 A | | 11/2012 | |
| WO | 9800284 A1 | | 1/1998 | |
| WO | 2007145513 A1 | | 12/2007 | |
| WO | 2008038901 A1 | | 4/2008 | |
| WO | 2008082297 A1 | | 7/2008 | |
| WO | WO-2008126068 A1 | * | 10/2008 | ........ H01J 37/32018 |
| WO | 2010047593 A1 | | 4/2010 | |
| WO | WO-2013110963 A1 | * | 8/2013 | ........ H01J 37/32449 |

OTHER PUBLICATIONS

WO-2013110963-A1 Silberberg et al. English Machine Translation retrieved from Espacenet Jul. 12, 2018 (Year: 2013).*
Definition for "at"; Merriam-Webster Dictionary; https://www.merriam-webster.com/dictionary/at (Year: 2019).*
Definition for "converge"; Merriam-Webster Dictionary ;https://www.merriam-webster.com/dictionary/converge (Year: 2019).*
Definition for "along"; Merriam-Webster Dictionary https://www.merriam-webster.com/dictionary/along; (Year: 2019).*
English Machine translation of Shimonishi JP-2002158219-A retrieved from Espacenet Feb. 25, 2020 (Year: 2020).*
English Machine Translation of Ueda (JP2008218254A) retrieved from Espacenet Sep. 17, 2020 (Year: 2020).*
English Machine Translation of Nakamura (JP2007042503A) retrieved from Espacenet Sep. 24, 2020 (Year: 2020).*
English Machine Translation of Kunugi (JP-2008277774-A) retrieved from Espacenet Sep. 17, 2020 (Year: 2020).*
English Machine Translation of Yashiro (JP-2008257920-A) retrieved from Espacenet Sep. 17, 2020 (Year: 2020).*
English Machine Translation of Kitahata JP2004127853A retrieved from Espacenet Jul. 7, 2021 (Year: 2021).*
Poodt, Paul, et al. "Patterned deposition by plasma enhanced spatial atomic layer deposition." physica status solidi (RRL)—Rapid Research Letters 5.4 (2011): 165-167.

* cited by examiner

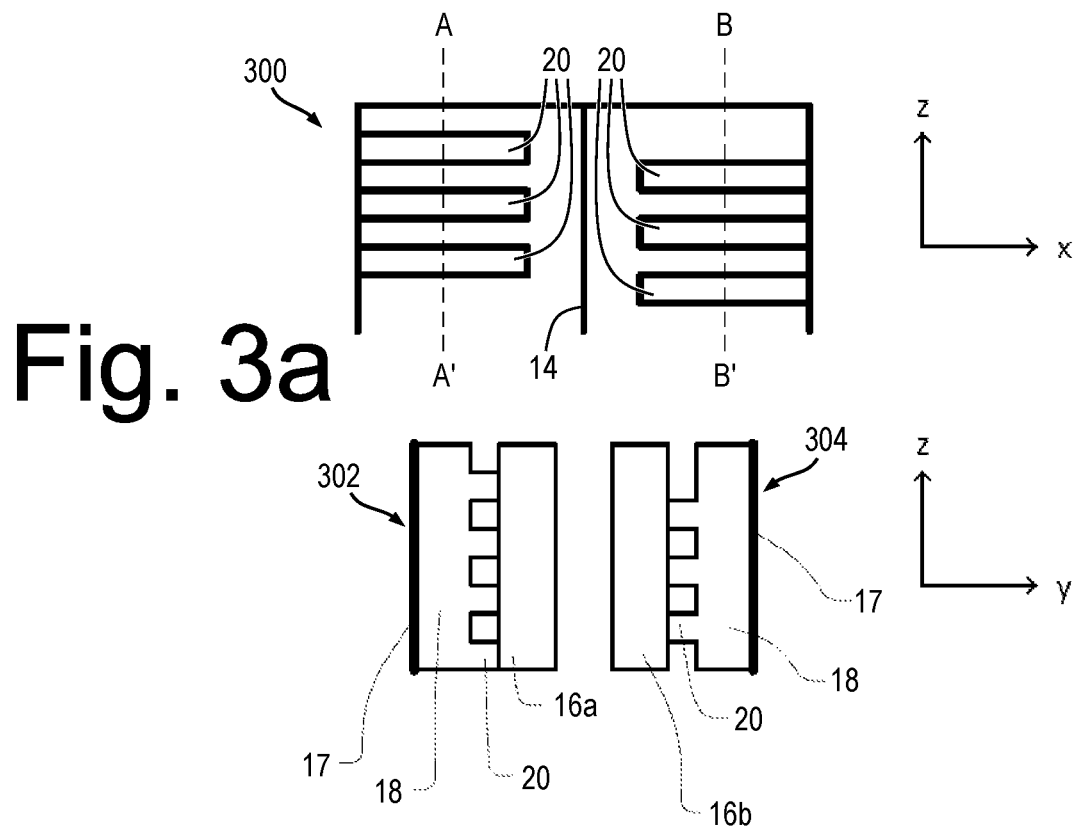
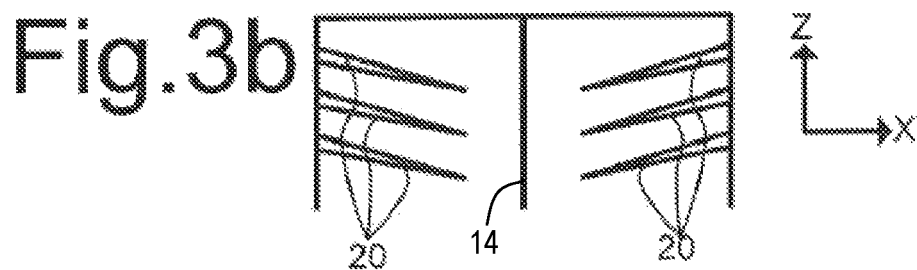

PLASMA SOURCE AND SURFACE TREATMENT METHOD

This application is the U.S. National Phase of, and Applicants claim priority from, International Patent Application Number PCT/NL2015/050463 filed 25 Jun. 2015, which claims priority from EP 14173878.1 filed 25 Jun. 2014, each of which is incorporated herein by reference.

FIELD OF THE INVENTION

The invention relates to a plasma source and a surface processing apparatus comprising such a plasma source, as well as to a surface processing method.

BACKGROUND

U.S. Pat. No. 8,328,982 discloses a plasma source that produces convergent atmospheric plasma flows from different directions at the aperture of the plasma source. The plasma source contains a first electrode with V shaped cross-section and a corresponding second electrode that is inserted between the legs of the V-shape, leaving gaps for gas flow between the V-shape and the second electrode along both legs of the V-shape. The outlet aperture of the plasma source is formed by a slot at the bottom of the V-shaped cross-section that extends along in the direction perpendicular to the plane of the V-shaped cross-section. In operation the sheet-like plasma jet is produced from the aperture.

In order to obtain an homogeneously distributed sheet-like plasma jet in U.S. Pat. No. 8,328,982, a high flow rate of helium gas is required. Only low concentrations of non-rare gases, such as oxygen or a coating precursor gas, can be added mixed with helium in order to maintain the plasma stable and homogeneous. In an example a mixed gas flow of 30 slm He and 0.5-2.0 slm $O_2$ has been used. A further disadvantage of devices according U.S. Pat. No. 8,328,982 is that it includes a short conduit from the plasma generation space to the outlet. In this conduit the side walls are substantially parallel with the flow direction. Within this conduit the plasma loses part of its reactivity.

SUMMARY

Among others, it is an object to provide for a plasma source and/or a surface processing apparatus for efficient transport and homogeneous delivery of short-living reactive plasma species at the surface of a substrate.

A plasma source according to claim 1 is provided. This plasma source has an outer surface relative to which the substrate may be transported leaving a narrow space between the surface of the substrate and the outer surface of the plasma source at the aperture. The plasma source excites the plasma in a plasma initiation space that ends at a sharp angle to the outer surface of the plasma source, between a surface of a first electrode that defines the outer surface of the plasma source and a dielectric layer on a second electrode inside the plasma source. The first surface of the first electrode defines the outer surface on a first side of the aperture, and the first electrode is bare of extension of the dielectric layer from the plasma generation space that could extend plasma generation to a part of the dielectric layer that is directly over the substrate, and thus could damage the substrate.

Preferably, the plasma initiation space is as thick as, or only slightly thicker than, the thickness of the ionized plasma, e.g. between 0.05 to 1 mm and in an embodiment its length need not be longer than 10 mm.

The sharp angle (i.e. an angle of less than ninety degrees between the surfaces at the edge, preferably smaller than forty five degrees, and more preferably less than thirty) makes it possible to produce dielectric barrier discharge (DBD) plasma close to the aperture and close to the substrate. The closeness of plasma generation to the aperture makes it possible to treat the substrate surface with primary plasma products like H, N and O radicals. In an embodiment a width of the aperture is limited to a small size without exposing the substrate to the electric field lines from the internal second electrode and its dielectric layer in a way that creates a risk of direct discharge to the substrate. In a preferred embodiment, the width of the aperture is smaller than 5 times (preferably less than twice) the distance from the dielectric layer at the aperture to a virtual extension of the outer surface through the aperture. This ensures that effects of the electric field from the second electrode are small at the nearby surface of the substrate, reducing the risk of direct electrical discharge to the substrate. In addition, substrates with components which are sensitive to electric or electromagnetic field can be treated in this way.

However, in another embodiment, the aperture may be much wider, e.g. such that no point in the aperture is more than two to three millimeters from the edge of the electrode from where plasma is supplied. It has been found that surface dielectric barrier discharge (SDBD) plasma supplied from the edge and covering a large part of the dielectric layer facing the aperture, prevents direct discharge from the dielectric layer to the substrate. Due to its conductivity, the SDBD plasma virtually extends the first electrode thereby reducing the electric field which would be present between the dielectric layer and the substrate without SDBD plasma.

The configuration of the first and second electrodes may be mirror symmetric with respect to a mirror plane through the middle of the aperture and perpendicular to the outer surface at the aperture. In this way the plasma supply rate can be increased and the plasma flow pattern at the aperture can be directed perpendicular to the substrate or at least the lateral velocity component may be reduced.

In an embodiment the transport mechanism of the plasma source is configured to position a surface of the substrate that faces the outer surface of the plasma source at a distance of at most half a millimeter from each other, preferably between 0.01 mm and 0.2 mm. In this way loss of plasma reactivity due to recombination of reactive plasma species before reaction with the substrate surface is reduced. In addition, the fluid (gas) flow that is used to create the plasma may be used as a gas bearing between the substrate and the outer surface of the plasma source once it has left the aperture.

In an embodiment dielectric and/or electrically conductive ridges between the second surface of the first electrode and the surface of the dielectric layer are provided. This provides for local enhancements of the applied electric field initiating dielectric barrier discharges. Gap-crossing conductive or dielectric ridges may be provided which extend from the second surface of the first electrode to the dielectric layer or vice versa. This provides for a surface dielectric barrier discharge (SDBD), for which a relatively low electric field suffices and which spreads more homogeneously on the dielectric layer. Preferably the ridges end short of the edge of the first electrode at the aperture. In this way homogeneity of the plasma at the aperture is improved. The ridges may extend directly from the gas inlet to the edge on the side of the aperture on which the ridges are provided. In an embodiment the ridges extend at an non-perpendicular angle to the edge of the first electrode on that side. This may be used to increase homogeneity of plasma treatment. When parts of the first electrode are provided on both sides of the aperture, ridges may be provided between parts of the first electrode and the dielectric on both sides, extending directly or at an angle to the edge on the side of the aperture on which they are located.

In the mirror symmetric configuration ridges may be used on both sides of the aperture. In this embodiment positions of projections of the first ridges on to the first side of the aperture may lie between (preferably midway between) positions of projections of second ridges on to the first side of the aperture. Thus each ridge points at a space between ridges on the opposite side of the aperture. This increases plasma homogeneity in the aperture.

The plasma source is particularly suitable for use in atomic layer deposition (ALD) where a substrate is repetitively exposed to a sequence of reactants (at least two) providing surface limited growth of a layer. The plasma source can be used to provide one or more of the successive reactants and a series of plasma sources may be used. The plasma source providing very reactive plasma species makes it possible to reduce the space and/or the time needed for co-reactants to react with the surface until saturation. This allows to increase the substrate speed in spatial ALD processing. In other embodiments, the plasma source may be used for other atmospheric pressure plasma surface treatment applications where chemical reactive plasma species (radicals, ions, electronically and vibrationally excited species) are needed to react with the surface. Examples of such applications are cleaning or etching by oxidation (for example using O radicals) or reduction (using H radicals), activation for adhesion improvement and plasma-enhanced chemical vapor deposition (PECVD).

By supplying the plasma at a sharp angle to the direction of the outer surface of the plasma source, the reactive plasma species can be supplied efficiently and homogeneously to the surface of the substrate for this purpose.

The symmetric arrangement makes it possible to generate plasma radicals by recombination at the aperture. In an embodiment a plasma surface treatment method is provided that uses a plasma source with an outer surface with an aperture for supplying a plasma, parts of the outer surface on opposite first and second sides of the aperture being defined by a first and third surface of a first electrode of the plasma source that form extension of each other on opposite sides of the aperture, the method comprising transporting a substrate and the plasma source relative to each other, a surface of the substrate being in parallel with the outer surface at the aperture;

applying an electric voltage between the first electrode and second electrode of the plasma source to excite a plasma in a first and second plasma initiation space between a surface of a dielectric layer on a second electrode of the plasma source, and a second surface and fourth surface of the first electrode opposite the surface of a dielectric layer respectively, the second surface and fourth surface of the first electrode ending at sharp angles to the direction of the outer surface on the first and second side of the aperture respectively;

supplying a first and second gas flow each comprising a respective different precursor through the first and second plasma initiation space respectively, so that different primary reactive plasma species are generated in the plasmas initiated in the first and second plasma initiation space respectively, and the different primary reactive plasma species react with each other at the aperture to produce a secondary reactive plasma species, e.g. by recombination. By producing reactive plasma species from different sides that react only at the aperture, the secondary plasma species is produced near the substrate where it is needed.

In an embodiment the first gas flow may comprise $O_2$, $N_2O$ and/or $CO_2$ as precursor to produce O as primary radical that forms a primary reactive plasma species. The second gas may comprise $H_2$ or $NH_3$ to produce H as primary radical that forms a primary reactive plasma species. When the primary plasma species, meet at the aperture, short living secondary radicals such as OH and $HO_2$ radicals are produced as secondary reactive plasma species in close vicinity to the substrate. As a consequence more OH radicals can react with surface sites before recombination. In another example the first gas flow may comprise $N_2$ or another N source to produce primary N radicals in and the second gas flow may comprise $H_2$ to produce primary H radicals, in which case secondary radicals such as NH and $NH_2$ are produced. The use of different gas flows on different sides of the aperture is particularly suitable for atomic layer deposition using such secondary radicals.

BRIEF DESCRIPTION OF THE DRAWINGS

These and other objects and advantageous aspects will become apparent from a description of exemplary embodiments with reference to the following figures.

FIGS. 3a,b illustrate alternative embodiments showing exemplary arrangements of the ridges introduced in FIG. 2, in bottom and side cross-sectional views or bottom view respectively

DETAILED DESCRIPTION OF EXEMPLARY EMBODIMENTS

Figure 1:
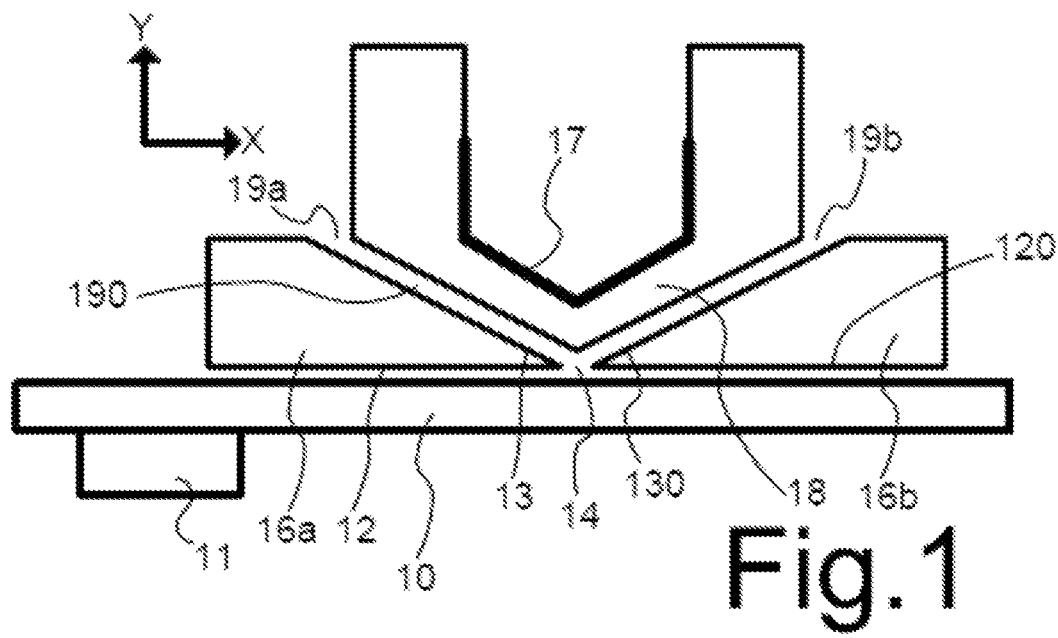
FIG. 1 shows a cross-section of a surface processing apparatus in side view

FIG. 1 shows a cross-section of an exemplary embodiment of a surface processing apparatus for processing a substrate 10. Substrate 10 may be part of a flexible foil or a rigid plate such as a semi-conductor wafer for example. In the illustrated embodiment the surface processing apparatus has a flat planar outer surface 12 that faces substrate 10, but alternatively a curved shape may be used. In exemplary embodiments the distance between outer surface 12 and substrate 10 is in the range of 0.01 to 0.2 mm or at most 0.5 mm. An aperture 14 in outer surface 12 is used to feed a jet of atmospheric plasma to the space between substrate 10 and outer surface 12. As used herein atmospheric means not effectively vacuum, e.g. between 0.1 and 10 Bar. In an embodiment aperture 14 is at least 100 mm long and 0.3 mm wide.

For reference x and y coordinate directions in the plane of cross-section have been indicated, the x-direction running parallel to the surface of substrate 10 below aperture 14 and the y direction being normal to that surface. Aperture 14, which will also be referred to as nozzle, extends along a line perpendicular to the plane of the drawing (the z-direction, not shown).

The surface processing apparatus comprises a transport mechanism 11, a first electrode 16a,b of electrically conductive material (preferably grounded or at the same potential as the substrate if the substrate is not grounded), a second electrode 17 of electrically conductive material, a dielectric layer 18 on second electrode 17 and fluid inlets 19a,b on both sides of second electrode 17. Transverse to the plane of drawing first electrode 16a,b, second electrode 17 and dielectric layer 18 extend at least along the length of aperture 14. In addition, the surface processing apparatus may comprise an electric voltage generator (not shown) coupled to first and second electrode 16a,b and 17, for applying a voltage between second electrode 17 on one hand and first electrode 16a,b on the other. Alternatively, an electric voltage generator external to the surface processing apparatus may be used.

Transport mechanism 11 is shown only symbolically. By way of example, it may comprise a conveyor belt for transporting substrate 10, or a table and a motor to drive the table, or a roll to roll (R2R) mechanism may be used comprising a first and second of rotating roll from which a substrate 10 such as a foil is rolled off and onto respectively. In other embodiments the transport mechanism may comprise a motor to move substrate 10 with respect to the assembly of first and second electrode 16a,b, 17 or vice versa. In another embodiment the electrodes may be integrated in a rotating drum, aperture 14 exhausting from the surface of the drum, in which case the transport mechanism may comprise a motor to directly or indirectly drive rotation of the drum.

First electrode 16a,b has a first and second wedge shaped portion 16a,b, each of which ends in a pointed edge at aperture 14. By way of example wedge shaped portions with flat surfaces are shown, but alternative curved surfaces may be used. First and second wedge shaped portions 16a,b made of stainless steel may be used for example. The fact that the portion has a wedge shape means that its upper surface 13, 130 and lower surface 120 converge toward the pointed edge, i.e. that their distance decreases. If the upper and lower surfaces run in a flat plane from the edge they are at angle to each other, the angle being larger than zero degrees and less than ninety degrees, preferably between ten and sixty degrees, more preferably less than forty five degrees and even more preferably thirty degrees or less. If a curved upper or lower surface is used, there is of course no fixed angle but preferably in the orthogonal cross section lines from the edges to points on the surface at a distance of three mm from the pointed edge are at angles in the range described for flat planes.

Although first and second wedge shaped portion 16a,b are shown to be separate from each other in the plane of cross-section of the figure, they may run over into each other at the ends of aperture 14 in planes of cross-section parallel to that of the figure. Thus, a connection between first and second wedge shaped portions 16a,b may form opposite ends of aperture 14 transverse to the elongated direction of aperture 14. Alternatively, side walls connected to first and second wedge shaped portion 16a,b may be provided to form the ends of aperture 14.

In an exemplary embodiment, the lower surfaces 120 of the wedge shaped portions 16a,b lie in a single flat plane and form the outer surface 12 of the surface processing apparatus that faces substrate 10. In an embodiment, the lower surface 120 of the wedge shaped portions 16a,b facing substrate 10 may be coated with a thin layer of material such as silica, alumina that reduces the radical recombination rate at this surface. The upper surfaces 130 of the wedge shaped portions 16a,b form a V-shaped groove that is open at its lower end at aperture 14.

Second electrode 17 has a lower surface of the same shape as the V-shaped groove, with electrode surface parts that extend in parallel with the upper surfaces of the first and second wedge shaped portion 16a,b of the first electrode. Dielectric layer 18 is present on the lower surface of second electrode 17. An aluminum oxide dielectric layer 18 may be used for example. As another example, silicon carbide may be used as a dielectric layer 18. Silicon carbide has the advantage that it is highly resistant to plasma, which reduces wear. Second electrode 17 may be of metal or graphite. When a silicon carbide is used as a dielectric layer 18 use of a graphite second electrode has the advantage that the thermal expansion coefficient of second electrode 17 dielectric layer 18 are closely matched. In an embodiment second electrode 17 may be realized as a film electrode on dielectric layer 18. Alternatively, dielectric layer 18 may be provided on a more voluminous second electrode structure.

The lower surface of dielectric layer 18 fits the V-shaped groove, leaving thin flat planar spaces for fluid flow between the lower surface of dielectric layer 18 and the upper surfaces of first and second wedge shaped portion 16a,b of the first electrode. In an embodiment dielectric layer 18 has the same thickness everywhere on the V-shaped part. Preferably, the distance between the lower surface of dielectric layer 18 and the upper surfaces of first and second wedge shaped portions 16a,b are constant within these planar spaces. These planar spaces extend from inlets 19a,b to aperture 14 respectively.

A surface dielectric barrier discharge (SDBD) plasma source with a silicon carbide dielectric can be used in any configuration, not just the one disclosed in the figures of the present application. Such a SDBD plasma source may contain an electrode comprising a graphite structure with a silicon carbide dielectric coating on at least part of its surface. In a further embodiment such a SDBD plasma source may comprise a graphite structure with different coating layers including a silicon carbide dielectric coating on at least part of its surface and a further coating layer of doped conductive silicon carbide or TaC on at least part silicon carbide dielectric coating and/or on part of the surface of the electrode. A monolithic DBD or SDBD plasma source based on graphite with coated substrates may be realized, (e.g. using a first and second electrode contained within in one solid structure with SiC and optionally TaC coatings).

A surface dielectric barrier discharge (SDBD) electrode system with Silicon carbide as a dielectric on graphite may be manufactures as follows. In a first step, a graphite base material is machined to a graphite structure of a desired shape. For example a graphite structure in the form of second electrode 17 may be made. In a second step, the graphite structure is coated with a Silicon carbide dielectric (preferably using high purity and crystalline Silicon carbide). High temperature CVD may be used to perform this coating step.

In an embodiment, uniform thickness coating process may be used. But in other embodiments non uniform thickness coating may be used. Non uniform thickness coating may be used to form ridges or grooves on or in the dielectric coating, e.g. by using coating masks or by machining the coated layer and/or the graphite. Different coating thicknesses can also be realized dependent on the orientations of different surface parts. Machining may be preformed by grinding and powder polishing using diamond materials.

Use of coating masks is easier than machining due to the hardness of Silicon carbide. In order to avoid machining or significantly reduce the material to be removed by grinding and polishing, ridges can be first easily made in the graphite and the resulting graphite structure can then be coated with Silicon carbide material(s).

In an embodiment multiple steps of Silicon carbide coating, or steps involving different materials may be used. For example, a first coating step may be followed by a second coating step, wherein part of the coating of the first step is coated in a second step to realize a non-uniform thickness. Masking may be used to obtain a partial coverage, optionally in combination with grinding.

In another embodiment different doping, or different materials may be used in different steps. For example, steps of coating with higher resistivity Silicon carbide (e.g undoped Silicon carbide) and lower resistivity Silicon carbide may be used (e.g. nitrogen doped), to form effectively insulating and conductive Silicon carbide for plasma generation purposes. Doped Silicon carbide may have a resistivity of 0.1-1 Ohm cm. Like pure Silicon carbide, conductive Silicon carbide may be deposited using high temperature CVD. Alternatively, steps of coating with higher resistivity Silicon carbide and a lower resistivity TaC may be used.

Part of the steps may included coating masking, or different masks may be used in different steps.

In one embodiment a partial lower resistivity Silicon carbide coating may be deposited on top of a higher resistivity coating. In this way, a monolithic surface dielectric barrier discharge electrode structure can be obtained. In an embodiment. For example second electrode 17 may be made in this way, by using a graphite structure with the V shape of second electrode 17, coating with dielectric Silicon carbide optionally followed by partial coating with doped (conductive, i.e. low resistivity) Silicon carbide to form ridges.

Silicon carbide is extremely plasma-erosion resistive (even for different gas environments, reducing or oxidative, in presence of O, H and N radicals). This is especially advantageous for use with an atmospheric pressure plasma, because such a plasma is less uniform than low pressure plasma and the plasma more easily etches the electrodes causing contamination.

A monolithic structure and elongated (>0.5 meter) can be manufactured using the good adhesion between Silicon carbide and graphite and minimal differences in coefficients of thermal expansion between high and low resistivity types of Silicon carbide.

Although doped Silicon carbide is low resistive, the resistivity of 0.1-1 Ohm cm may be too high for long structures based with a limited cross sections of the material. However, the problem can be solved by using low resistivity Silicon carbide on graphite (avoiding direct exposure of graphite to plasma), or using low resistivity Silicon carbide pressed against another better conductor which is less exposed to the thin plasma layer.

In operation, a high-frequency electric voltage difference is applied between first electrode 16a,b and second electrode 17 by a generator (not shown). First electrode 16a,b may be kept at a constant potential, e.g. ground potential, a high frequency potential being applied to second electrode 17. The combination of first and second electrodes 16a,b, 17 and dielectric layer 18 functions as a dielectric barrier discharge (DBD) or surface dielectric barrier discharge (SDBD) plasma generator. A gas which may be a pure gas or a mixture of gases ($N_2$, $O_2$, $O_2^-$, $N_2O$, $H_2$, $NH_3$, etc.) is supplied through inlets 19a,b and flows from inlets 19a,b to aperture 14 via the planar spaces 190 between the lower surface of dielectric layer 18 and the upper surfaces 130 of the first and second portion 16a,b of the first electrode. The high-frequency electric field in these spaces 190 resulting from the voltage differences ionizes the gas, creating plasma. The ionized gas flows into aperture 14, where it forms an atmospheric plasma, i.e. a plasma in a gas of considerable pressure. Atmospheric plasma tends to extinguish quickly, even within a period of the high frequency electric voltage. As result, the plasma has to be re-initiated periodically. The initiation, i.e. the start of re-appearance of ionization occurs in the planar spaces 190. Accordingly, these spaces, part thereof or x-position range therein where initiation occurs will be called plasma initiation spaces. Above aperture 14, the plasma tends to cling near dielectric layer 18 of second electrode 17 in the time intervals between initiation and extinction. Therefore, the plasma may be called a sheath of dielectric layer 18.

Plasma may contain free electrons, ions, electronic and vibrational excited molecules, photons and radicals besides neutral molecules. Many of the plasma species are chemical reactive and can be denoted as Reactive Plasma Species (RPS). The nature and concentration of RPS depend on gas composition and electrical plasma conditions. Furthermore, fast recombination processes cause strong variations of RPS both as function of space and as function of time. Examples of chemical reactive radicals produced by means of plasma in common gases as $N_2$, $O_2$ and $H_2$ are N, O, H, NH, OH and $HO_2$. Other examples of RPS are electronic or vibrational excited atoms and molecules. The plasma, containing significant concentrations of RPS, flows through aperture 14 and from there laterally through the space between substrate 10 and outer surface 12 to both sides of aperture 14. Below aperture 14, and to some extent aside of it, the RPS interact with the surface of substrate 10.

As will be appreciated, the angle between the upper and lower surface of first electrode 16a,b and the sharp edges of first electrode 16a,b adjacent aperture 14 make it possible to excite plasma between the upper surface and dielectric layer 18 up to points close to the upper surface of substrate 10. This makes it possible to transport RPS faster to the upper surface of substrate 10 and to treat the upper surface of substrate 10 with primary RPS before significant loss of RPS occurs.

Aperture 14 can be made so narrow that the fluid flow direction through aperture 14 is directed more downward than sideways over more than half of the aperture. This makes it possible to drive the reactive plasma products (RPS) closer to the upper surface of substrate 10. This also improves treatment of the upper surface of substrate 10 with primary plasma products.

As will be appreciated, the first electrode 16a,b largely shields substrate 10 from the electric field from second electrode 17. Because substrate 10 is further from second electrode 17 than the portions of first electrode 16a,b on either side of aperture 14 and the upper surfaces of the wedge shaped portions 16a,b are at an angle of less than ninety degrees to one another, the electric field lines from second electrode 17 above aperture 14 tend to bend off towards the upper surfaces of the portions of first electrode 16a,b. To provide for shielding, the width of the aperture 14 is preferably smaller than five times and more preferably smaller than twice the distance from the dielectric layer 18 at the aperture 14 to a virtual extension of the outer surface 12 through the aperture 14. The increasing thickness of first electrode 16*a,b* with distance from aperture 14 provides for effective transport of the heat generated due to the energy dissipated in the plasma.

Preferably, the edges of the wedge-shaped portions 16*a,b* of the first electrode along the aperture are sharp, e.g. with a radius of curvature less than 0.1 mm or at most less than 1 mm. In this way recombination losses in the plasma before the plasma interacts with substrate 10 is minimized.

Use of a configuration wherein the location of plasma generation is close to the substrate to be treated with the plasma entails the risk that plasma will be generated at the substrate. For many treatments this is undesirable. Plasma generation at the substrate will occur when there is a high electric field at the substrate. Moreover, already by itself a high electric field at the substrate may cause damage to some substrates. The use of a grounded lower electrode 16*a,b* leaving a small aperture near the plasma generation space reduces these effects because it reduces the electric field at the substrate.

Another circumstance under which plasma generation can occur at the substrate is when the dielectric layer on which the plasma is generated extends so far that it lies above the substrate with nothing to shield it in between. Plasma generation tends to creep over the entire dielectric layer, because the plasma forms a conductive sheet close to the substrate.

For example, suppose that a dielectric layer is used on the lower electrode 16*a,b*, in such a way that a final part of this dielectric layer extends beyond the tip of the lower electrode 16*a,b*, or even around the tip and thus faces the substrate. This would have the effect of causing plasma generation on the part of this dielectric layer that faces the substrate, i.e. directly over the substrate, with a damaging effect on the some substrates.

This is avoided because the conductive surface of lower electrode 16*a,b* is directly exposed to the substrate, bare of any extension of the dielectric layer from the plasma generation space that could extend plasma generation to a part of the dielectric layer that is directly over the substrate. No such extension is present on the lower surface of lower electrode 16*a,b* or on a part of the upper surface from which it extends over the aperture above the substrate.

The high-frequency electric voltage is preferably periodic. In exemplary embodiments the high-frequency electric voltage may contain alternate voltage pulses of opposite polarity e.g. with a duty cycle of 1-10%, but alternatively a sine-shaped voltage may be used. The repetition frequency of the periods may be used to control the power transferred to the plasma, which should be sufficiently high for processing purposes but not excessively high to avoid undue heating. In exemplary embodiments a frequency in a range from 1-100 kHz is used, but this may depend on the type of gas used. The voltage should be sufficient to sustain plasma. It may be selected experimentally dependent on gas conditions. In exemplary embodiments, for plasma generation in air or nitrogen a voltage in a range of 4 to 20 kV is used when the plasma is generated by surface dielectric barrier discharge or 15-40 kV in the case of a gap crossing dielectric barrier discharge.

The thickness of dielectric layer 18 is selected so that it is at least thick enough to avoid discharge through dielectric layer 18. There is no fundamental upper limit on the thickness, but to keep the high-frequency electric voltage required to sustain the plasma low, the thickness is preferably not much more than the minimum. In exemplary embodiments a thickness in a range of 0.1 to 2 mm is used, e.g. 0.15 mm. The plasma is initiated in the planar spaces between the lower surface of dielectric layer 18 and the upper surfaces of first and second wedge shaped portion 16*a,b* of the first electrode. The plasma develops mainly on the surface of dielectric layer 18. The thickness of the planar spaces is preferably selected so that it does not limit the thickness of the plasma. On the other hand it is preferably kept small to increase the gas flow speed that can be used and to bring the plasma closer to aperture 14. The thickness may be adapted to optimize plasma output.

In exemplary embodiments a space thickness in a range of 0.05 to 1 mm is used, for example 0.1 mm. The length of the planar space (i.e. the distance between aperture 14 and the location at inlet 19*a,b* where the distance between first and second electrode is so large that no plasma is excited) may be selected to ensure development of optimal concentration of RPS in plasma at aperture 14. With increasing distance this concentration saturates, so that a length of the spaces above a threshold only leads to losses. The length may be selected experimentally dependent on process circumstances, such as the gas used. In exemplary embodiments a length in a range of 1-10 mm is used, for example 3-4 mm.

The dielectric barrier can be obtained from extruded tubes e.g. ceramic tubes or from ceramic coated metal tubes. Tubular structures offer high intrinsic mechanical strength. Shapes can also be squared, hexagonal, etc. Two or more surfaces are machined to comply with the mechanical tolerances required for the contact surface areas between the first electrode and the dielectric barrier. Solid dielectric ridges with various shapes can be obtained from ceramic tubes or plates in combination with precision machining methods. Alternatively, pre-defined and machined conductive structures can be coated with a ceramic dielectric barrier.

In an embodiment flows of gas with the same composition are supplied to both inlets 19*a,b*. A single gas source (not shown) may be used coupled to both inlets 19*a,b*. The gas source may comprise sub-sources for the different components of the gas and a gas mixer with inputs coupled to the sub-sources and outputs coupled to inlets 19*a,b*. In an alternative embodiment, two gas flows with respective different compositions may be supplied. In this embodiment reactive plasma species of different types may be generated in the spaces between the lower surface of dielectric layer 18 and the upper surfaces of first and second wedge shaped portion 16*a,b*. In this embodiment different gas sources may be used, coupled to the respective inlets 19*a,b* or different mixers may be used. By selection of the composition of precursors different reactive plasma species may be generated in the different spaces between the electrodes, which react within the plasma jet outlet aperture.

For example a first gas flow may be used to produce O-radicals from $O_2$, $N_2O$ or $CO_2$. The second gas flow may be used to produce H radicals from $H_2$ or $NH_3$. By mixing the primary RPS from both gas flows, short living secondary radicals such as OH and $HO_2$ radicals are produced in close vicinity to the substrate 10. As a consequence of producing those radicals in a directed gas flow very close to the substrate surface, more OH radicals can react with surface sites before recombination to $H_2O_2$. In the same way, primary N radicals in a first gas flow may react with primary H radicals in a second gas flow producing secondary NH and $NH_2$ radicals in the resulting gas flow through aperture 14.

The gas flow rate from inlets 19*a,b* (e.g. mass or volume per second) may be selected dependent on the desired rate of reactive plasma species on substrate 10. In an example a rate of 1000-2000 cubic mm per second, per mm length of aperture per inlet 19, b is used, or in a corresponding mass flow range obtained by assuming a pressure of one atmosphere and a temperature of 25 degrees centigrade. The gas flow speed through the spaces between the lower surface of dielectric layer 18 and the upper surfaces of first and second wedge shaped portion 16a,b corresponds to the flow rate divided by the cross-section area of the spaces (thickness times width). By keeping the cross section area small, a high flow speed is realized. High flow speed has the advantage that less loss will occur due to recombination of radicals and ions prior to reaction on substrate 10.

The gas that flows from aperture 14 into the space between first electrode 16a,b and substrate 10 may be used as a gas bearing to keep and first electrode 16a,b and substrate 10 apart. Exhaust conduits (not shown) may be provided through first electrode 16a,b on both sides of aperture 14, or between first electrode 16a,b and adjacent parts above substrate 10 to exhaust gas from the space between first electrode 16a,b and substrate 10. This may be used to reduce reaction with the surface beyond the exhausts.

Optionally, conduits of a fluid cooling circuit may be incorporated in the wedge-shaped portions 16a,b of the first electrode.

Figure 2:
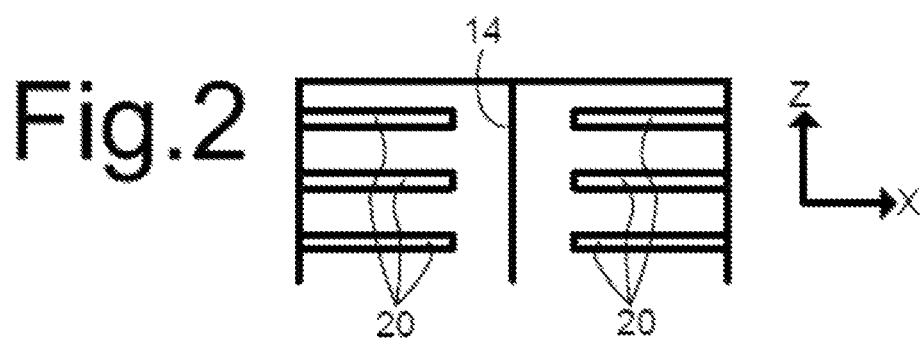
FIG. 2 shows part of the apparatus in bottom view

FIG. 2 schematically shows cross-sections in bottom view of an embodiment, the cross-sections being through planes in the spaces between the upper surfaces of first and second wedge shaped portion and the lower surface of dielectric layer (of course these planes of cross-section are at an angle to each other on opposite sides of the aperture, but for the sake of illustration they are schematically shown in a single cross-section). In the figure, the z-direction is the direction along the length of the aperture. Only part of the length of the cross-section in the z-direction is shown.

In the illustrated embodiment ridges 20 are included in the space between the lower surface of dielectric layer 18 and the upper surfaces of first and second wedge shaped portion 16a,b of the first electrode. Ridges 20 form contact surface areas between dielectric material and conductive material, located in connections between first electrodes 16a,b and dielectric layer 18. Between pairs of adjacent ridges 20, openings are defined for gas flow towards the aperture 14. Ridges 20 may be ridges on dielectric layer 18 that press against first electrode 16a,b or ridges on first electrode 16a,b that press against dielectric layer 18 for example, or they may comprise ridges on both that press against each other, i.e. so that little or no space for gas flow is left where the ridges press, compared to the space adjacent the ridges. In an embodiment a conductive layer may be provided on top of the ridges. This has the effect that the electric field in any remaining space for gas flow is reduced or eliminated, to provide for better controlled plasma generation. In an embodiment the ridges may be realized as material that is left when the space between different ridges is removed from dielectric layer 18 and/or first electrode 16a,b. Adjacent ridges 20 space is left for gas flow between ridges. In operation, plasma initiation occurs along ridges 20, so that the ridges 20, when present, define the location of the plasma initiation space.

Ridges 20 may be ridges of dielectric material on dielectric layer 18, e.g. the same material as dielectric layer 18, in which case ridges 20 may be integral with dielectric layer 18. In this case the contact surfaces are formed between the dielectric (non conductive) ridges and first electrode 16a,b. In another embodiment ridges 20 may be of electrically conductive material, e.g. the same material as first electrode 16a,b, in which case ridges 20 may be integral with first electrode 16a,b. In this case the contact surfaces are formed between the electrically conductive ridges and dielectric layer 18. Alternatively, a ridge 20 may comprise both an electrically conductive ridge part on first electrode 16a,b and a dielectric ridge part on dielectric layer 18, in which case the contact surface is present within the ridge.

Ridges 20 may be created by removing material in grooves from the surface of dielectric layer 18 and/or the upper surfaces of wedge shaped portions 16a,b of the first electrode, ridges comprising material left between the grooves. Solid dielectric ridges with various shapes can be obtained from ceramic tubes or plates in combination with precision machining methods. Alternatively, pre-defined and machined metallic structures can be coated with a ceramic dielectric barrier. In an embodiment conductive ridges may be deposited on dielectric layer 18 and pressed against first electrode 16a,b.

Ridges 20 can have various shapes, e.g. squared, circular or elongated. Preferably, elongated ridges are used which have their longest direction extending transverse to the pointed edges of wedge shaped portions 16a,b. Thus, gas flow directed towards aperture 14 is possible between ridges 20. Ridges 20 define conductor-dielectric contact surface areas between first electrode 16a,b and dielectric layer 18. Ridges 20 may be from 0.1 to 1 mm wide for example, in an embodiment 0.4 mm or wider.

A constant width is shown by way of example. In other embodiment the width may vary, e.g. using a width that decreases with decreasing distance to aperture 14. This increases plasma homogeneity at aperture 14. Preferably ridges 20 stop short of the edge of the wedge-shaped portions of first electrode 16a,b. The distance between the edge and the contact surface areas may be in a range of 0.2-5 mm for example, preferably about 1 mm. The distance between successive ridges may be in the range of 0.1 to 5 mm for example, more preferably 0.4 to 5 mm for example 2.5 mm.

As a result of ridges 20 micro-discharges will be formed along the entire length of an elongated solid dielectric barrier structure. In operation, plasma initiation occurs along ridges 20, so that the ridges 20, when present, define the location of the plasma initiation space. As used herein, the plasma initiation space is the range of positions in the x direction (range of distances from the edge) where plasma initiation occurs. Due to the distance between the ends of ridges 20 and the edge, the plasma initiation space ends at that distance from the edge.

The contact surface areas between dielectric layer 18 and first electrode 16a,b give rise to surface dielectric barrier discharge (SDBD). Patent publications WO 2008/082297 and WO 2010/047593 describe various aspects of SDBD plasma jets using elongated dielectric barrier structures.

The wedge shaped first electrode 16a,b and ridges 20 result in surface dielectric barrier discharge (SDBD) on the dielectric layer (18) in very close vicinity with the substrate (10). In order to obtain an optimum distribution of micro-discharges over the dielectric barrier, it is proposed to use a plurality of parallel ridges arranged in a periodically repeating pattern to generate a regular pattern of micro-discharges as surface dielectric barrier discharge. A distance of 2.5 mm between successive ridges 20 may be used. Using a plurality of parallel ridges 20 for SDBD plasma initiation, strongly reduces the probability that DBD plasma initiates as Volume DBD from the edge of the wedge shaped first electrodes.

The contact between the first electrode and the solid dielectric structure (contact surface areas) can be provided using mechanical pressure exerted between the solid dielectric structure and the first electrode to press both together.

Alternatively, adhesive connections may be used. Use of mechanical pressure instead of adhesion has the advantage that the required tolerances of the electrode configuration can be maintained under influence of temperature variations and mechanical vibrations. The (mechanical) pressure can be obtained using springs (not shown), connected to act between the first electrode and the solid dielectric structure. Preferably a constant pressure is used.

It has been found that in some cases the presence of ridges 20 may lead to corresponding stripes on the substrate where the substrate material has been processed to a different degree. Increasing the distance between the ends of ridges 20 and the edge of the first electrode reduces this effect. If needed, this effect can be reduced in various other ways, for example interspaced ridges 20 on opposite sides and/or angled ridges 20 can be used.

FIG. 3a shows an embodiment wherein the z-coordinates of the endpoints of ridges 20 nearest to aperture 14 of first wedge shaped portion 16a are distributed so that they lie between (preferably midway between) z-coordinates of the endpoints of ridges 20 on second wedge shaped portion 16b. The upper structure 300 in FIG. 3a is a bottom view in an x-z coordinate system, while the lower left structure 302 and lower right structure 304 are side cross-sectional views in a y-z axis coordinate system taken along the dotted lines A-A' and B-B' indicated on the left and right portions of the upper structure 300, respectively. Herein, the z-direction along which the z-coordinate is measured in the direction along the elongated direction of aperture. This results in an even more homogeneous plasma distribution at aperture 14. When ridges 20 are arranged in a periodically repeating pattern, the patterns on first and second wedge shaped portion 16a,b are preferably shifted by half a period with respect to each other.

In an embodiment the contact surface areas can be realized by creating grooves in the upper surface of first electrode 16a,b. However, the use of flat upper surfaces of the first electrode 16a,b instead of a grooved surface counteracts the repetitive formation of micro-discharges at the same point of the electrode. Therefore, it is preferred to use ridges of dielectric material. As a result of better spreading of micro-discharges, the probability of local hot spot formation on the electrodes is significantly reduced, and accordingly, the probability of electrode erosion is reduced.

Preferably the dielectric thickness provided by dielectric layer is constant outside the contact surface areas. A constant thickness is advantageous for homogeneous distribution of micro-discharges.

FIG. 3b shows an embodiment wherein ridges 20 are directed at a non-perpendicular angle to the z axis (the direction of the edge of wedge shaped portion 16a,b). The center line of ridges 20 may make an angle of between eighty and forty five degrees with the edge of wedge shaped portion 16a,b. i.e. with the aperture for example, and preferably sixty degrees. An improved flow distribution, with a better homogeneity of RPS in z-direction is then obtained. The angle of the direction of ridges with respect to the x-axis is preferably in the range 10-45 degrees, preferably 30 degrees.

The angled arrangement may be used to increase homogeneity by improving flow distribution. Ridges 20 on opposite sides of the aperture are directed mirror symmetrically with respect to one another relative to a mirror plane at the center of the aperture. Alternatively, different angles may be used on different sides. As shown, pointed ridges 20 are used, with a width that diminishes with decreasing distance to the aperture. Such pointed ridges may be used in the embodiments of FIGS. 2 and 3a as well. In the embodiment of FIG. 3b ridges with parallel edges may be used as in FIGS. 2 and 3a.

Transport of Reactive Plasma Species (RPS)

Losses of reactive plasma species (RPS) during transport from the plasma through the narrow space geometry are mainly due to radical-radical recombination in the gas phase (e.g. $H+H \rightarrow H_2$) and radical losses due to collisions of radicals with the walls. In principle both types of losses can be reduced increasing the gas flow rate, thus decreasing residence time of RPS in plasma. However, the flow is preferably non-turbulent (i.e. laminar flow).

In conventional plasma processing transport of reactive gas to react on the surface of a substrate 10, is much dependent on diffusion. In the embodiment of FIG. 1, again diffusion will play a role, but the geometry creates a high gas velocity vector component perpendicular to the substrate surface in aperture 14, which will create a flow pattern characterized by a thinner diffusion layer below aperture 14 and near it. The reaction rates between RPS (even secondary) and the substrate being high, the localized flow pattern can result in more efficient transport of RPS towards the substrate surface.

High-Energy Density and Effective Temperature Conditioning

The average power (surface) density in the dielectric barrier discharge may be expressed as P/S (Watt/cm$^2$) where P is the plasma power and S the dielectric barrier surface area. The geometrical conversion factor f=S/A may be used to estimate the power (surface) density in the gas outlet aperture: P/A=f×P/S (W/cm$^2$), A being the outlet area of aperture 14. For elongated dielectric barrier structures, with two converging gas flow paths, each with a path length through the plasma of about 6 mm and a aperture space width of about 0.4 mm, the conversion factor will be f=30. Typically P/S can be in the range 1-2 W/cm$^2$. Thus in the given example power (surface) densities P/A in the jet outlet may reach 30-60 W/cm$^2$.

It is emphasized that the plasma power effectively dissipated by gas is the total dissipated electrical power minus the heat transfer to the electrode and dielectric barrier materials. For avoidance of excessive heating, the cooling of the first electrode and/or dielectric barrier may become desirable. Dependent on operation cooling may be practically useful for:

1. Control of the maximum allowed temperature of the plasma gas arriving at the substrate
2. Avoidance of breakdown of the dielectric barrier. The breakdown voltage of (preferred) alumina dielectric goes down with increasing temperature.
3. Reduced aging of electrodes exposed to the plasma.

The proposed electrode configuration is particularly suitable for temperature control:

1. The narrowness of the electrical discharge space, results in efficient heat transfer from plasma gas to the first electrode and dielectric barrier.
2. Cooling of the dielectric via cooling of an interior space in the solid dielectric barrier structure.
3. Cooling of the portions of the first electrode. The wedge-shape ensures heat transport by conduction from the electrode edge to the bulk of the electrode mass which can be actively cooled by various means (liquid or gas cooled heat sink, Peltier cooler).

The described geometry is suitable to achieve a high plasma power surface density P/A in combination with effective temperature conditioning via gas flow, heat conduction in the dielectric barrier and heat conduction in the wedge shaped electrode, even though it uses a large geometric factor S/A.

It may be beneficial for the desired plasma-enabled chemistry, to operate the proximity DBD plasma jet with a plasma gas temperature significantly higher than the substrate temperature. Since the treatment time can be very short, the energy transfer to the substrate can be limited and as a consequence the substrate temperature can be kept below a critical level.

Gas Bearing Function for Controlling the Distance to a Substrate

The proximity plasma jet can be combined with substrate gas bearing in sheet-to-sheet or roll-to-roll processes. Gas bearing is particularly useful for contactless, frictionless transport of scratch sensitive substrates 10 such as metal foils, plastics, wafers etc. It has been found that suitable gas flow conditions for plasma processing can be in the same range as gas flow conditions for gas bearing. Typical (experimental) plasma gas flows are in the range 500-5000 $mm^3$/sec per mm substrate width, or a corresponding mass flow range obtained by assuming a pressure of one atmosphere and a temperature of 25 degrees centigrade. Typical (experimental) gas bearing gas flows are around 1000-2000 standard $mm^3$/sec per mm substrate width. The shape of the first electrode allows for high gas velocities in the direction of substrate transport with moderate pressure drop.

Roll-to-Roll Version

Figure 4:
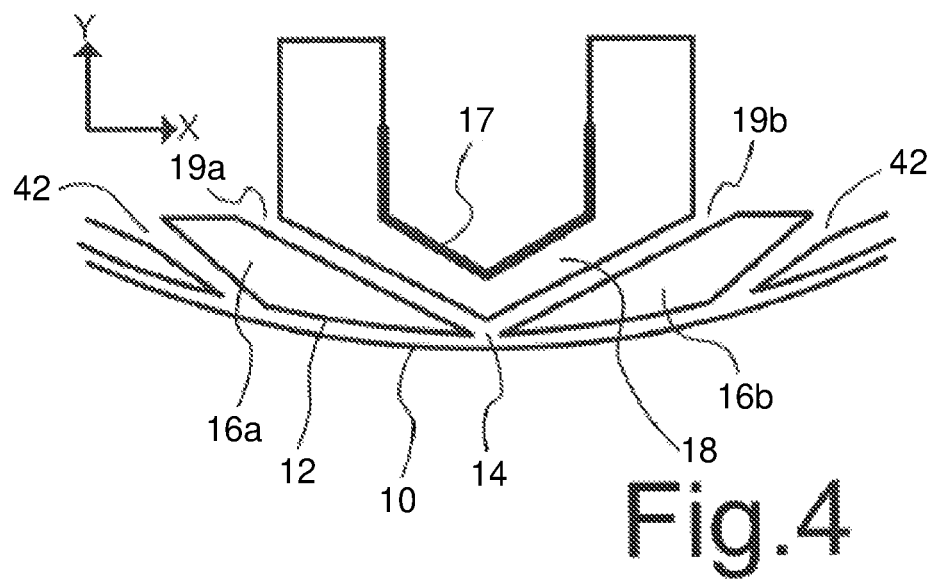
FIG. 4 shows a plasma source in a drum in side view

FIG. 4 shows an embodiment wherein the plasma source is included in a drum (only partly shown). During operation the drum may be rotated by a motor (not shown) to move the aperture 14 of the plasma source relative to a substrate 10 that runs over the drum. In addition the substrate 10 may be moved along the drum. The proposed electrode geometry can be integrated in a rotating drum in a roll-to-roll application increasing the relative velocity between plasma jet and moving substrate. In an embodiment a plurality of plasma sources may be included in the drum, with apertures at successive locations along the circumference of the drum. In a further embodiment, the drum contains additional apertures for gas flows containing coating precursor gases and purge gases. In the drum apertures for plasma gas flows are separated from each other by apertures for non-plasma based gas flows intended for purging and/or coating precursor gases. This configuration makes it possible to expose a flexible substrate successively to coating precursor gases and plasma containing reactive gases. This configuration is suitable for plasma-sustained spatial atomic layer deposition in a roll-to-roll configuration.

In FIG. 4, the lower surface of first electrode 16a,b, which forms the outer surface 12 of the plasma source, has a curved shape that forms part of the circumference of the drum (e.g. a circular circumference). Conduits 42 adjacent first electrode 16a,b or through first electrode 16a,b, are provided on both sides of aperture 14 to remove the gas flow introduced from aperture 14 after it has flown through the gap between the lower surface of first electrode 16a,b and the surface of substrate 10. In the illustrated embodiment, substrate 10 is a flexible foil that is wound along part of the circumference of the drum. In an embodiment, the distance between the flexible foil 10 and the outer surface 12 results from balance between the gas bearing force and the tensile force in the flexible foil.

Conduits 42 may be located beyond a point where substrate 10 diverges from the drum ("beyond" as seen from aperture 14). A pump (not shown) may be provided to pump gas from the gap between the lower surface of first electrode 16a,b and the surface of substrate 10. As a result, the gas acts as a gas bearing (gas bearing) to keep substrate 10 spaced from the lower surface of first electrode 16a,b.

Similar conduits 42 may be used in other embodiments wherein the plasma source is not located in a drum, or even where the lower surface of first electrode 16a,b is flat.

Conduits 42 and the pumping pressure in conduits 42 may be dimensioned to create a gas flow below the outer surface 12 in one direction. Thus gas flows below wedges on opposite sides of the aperture have the same direction, either both parallel to the movement of the substrate or both opposite to that direction.

In an embodiment plasma is generated only at one side of aperture 14 only. To ensure this, the dimensioning of the left and right side of the solid dielectric structure may be asymmetric with respect the central vertical plane that contains aperture 14, e.g. by using larger spacing to the first electrode on one side than on the other side or by leaving no spacing between the first electrode and the dielectric layer at one of the two sides.

SDBD Plasma Blanket Configuration

Figure 5:
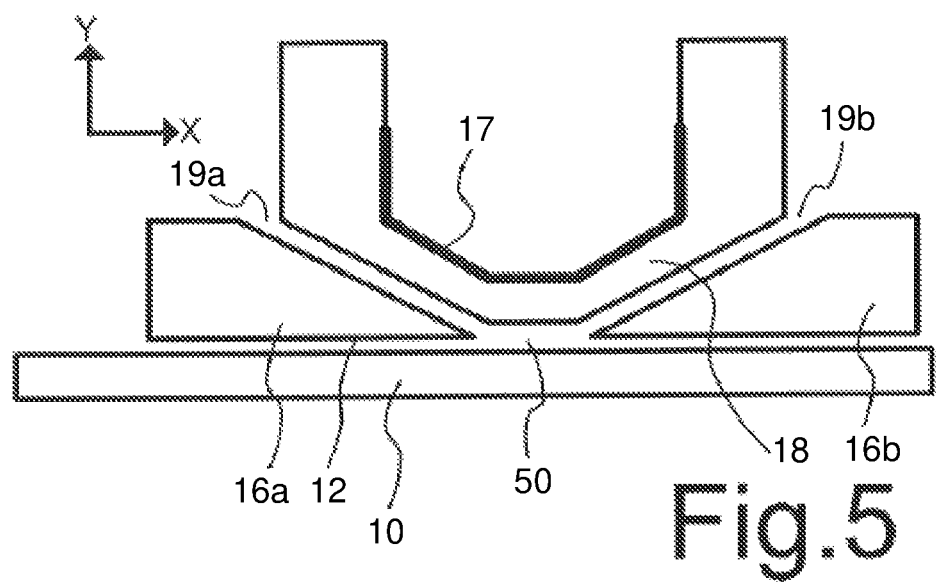
FIG. 5 shows a plasma source with a wide aperture for producing a plasma blanket in side view

FIG. 5 shows an embodiment for generating an extensive plasma sheath of dielectric layer 18, which can also be called plasma 'blanket', in parallel with the substrate 10. Herein a wide aperture 50 is used between the end edges of a first and second wedge shaped portion 16a,b of the first electrode adjacent the aperture 50 (in the cross-section shown in the figure the end edges are end points).

Surface DBD plasma is initiated from contact surfaces between the first electrodes 16a,b and dielectric layer 18 and extends over the dielectric layer 18. Surface DBD plasma extends on dielectric layer 18 facing the upper surfaces of first and second wedge shaped portions 16a, b. In addition, surface DBD plasma extends on the dielectric layer 18 facing the aperture 50, in parallel with the substrate 10. In the center of the aperture a central region may arise which is permanently devoid of surface DBD plasma initiated from contact surfaces at both sides. The width of this region is determined by the electrostatic repulsive force between micro-discharges. This width has experimentally been determined in the range 0.3-1.0 mm.

Preferably the width of aperture 50, the thickness of dielectric layer 18 and the applied voltage and frequency are chosen such that surface DBD plasma substantially covers the entire part of the surface of dielectric layer 18 that faces aperture 18 except for the central region that arises due to repulsion.

Minimization of the width of the region devoid of surface DBD plasma due to repulsion helps to avoid discharges between dielectric layer 18 and substrate 10, which could detract from the desired surface processing. The usefulness of the width of the aperture may be dependent on surface conductivity. A useful width may be determined experimentally using a test substrate and inspection of that test substrate for damage after exposure to the aperture. For the purpose of determination of the width, experiments may be carried out wherein the width is varied from a width of one millimeter up to a number of millimeters.

The electrode configuration presented in FIG. 5 provides a combination of a proximity plasma jet with parallel (blanket) surface DBD (SDBD) plasma. This may have the benefits of improved plasma homogeneity. The gas flow may enhance transport of RPS to the substrate surface and the first electrode can be more effectively cooled by gas flow, counteracting electrode erosion.

In an embodiment the wide aperture may be combined with ridges (not shown) like those of FIGS. 2 and 3, between first and second wedge shaped portion 16a,b and the dielectric layer 18 above it. In an embodiment the ridges may run on to the end edges. This increases the maximum useful width of aperture 50. The loss of homogeneity at the end edges compared to when the ridges stop short of the end edges is less a problem with a wide aperture 50 than with a narrow aperture as in the embodiment of FIG. 1, since the wider aperture provides for more overall homogeneity. Use of ridges with an offset in the z direction on opposite sides of aperture, as with reference to FIG. 3a may improve homogeneity in the embodiment of FIG. 5 as well. Similarly, use of angled ridges, as illustrated with reference to FIG. 3b may improve homogeneity.

Although FIG. 5 shows an embodiment wherein second electrode 17 is piece-wise flat, with a polygonal cross-section, with a flat piece in parallel with the outer surface 12 over at least a majority of the width of aperture 50, it should be appreciated that other shapes could be used, such as a cylindrical shape with a circular, elliptic (oval, preferably with the longest axis parallel to outer surface 12) cross-section or cross-section part with a diameter that is wider than aperture 50 that is directed parallel to outer surface 12 over the central line of the aperture.

Other Embodiments

Figure 6:
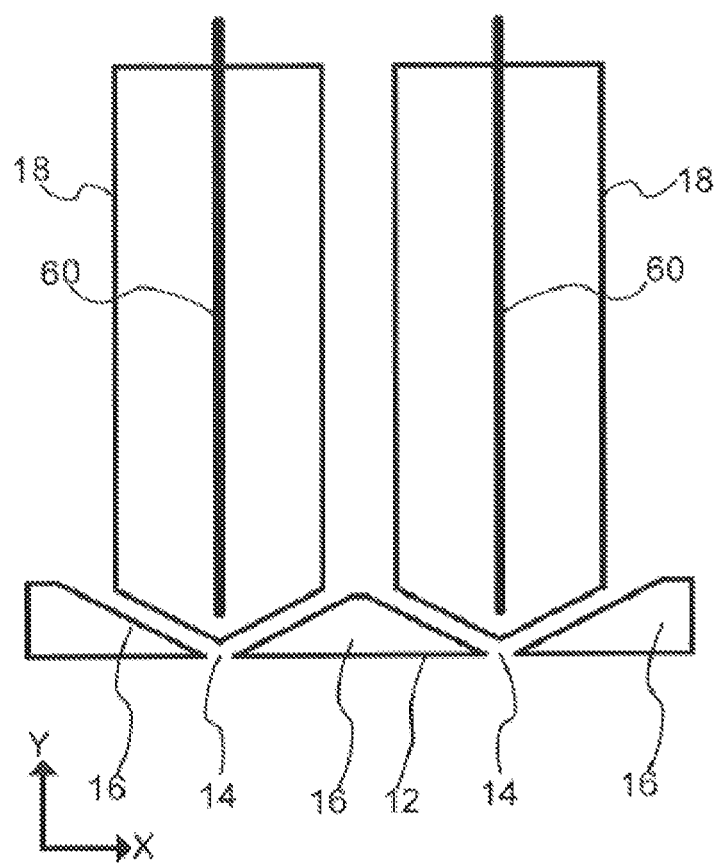
FIG. 6 shows a plasma source with compact elements in side view

FIG. 6 shows a compact embodiment wherein a central second electrode plate 60 is used instead of a second electrode that runs in parallel with the upper surface of the first electrode 16. This makes it possible to reduce the width (in the x-direction) of the device. In the illustrated embodiment this is used to provide for a first and second plasma unit, each with its own aperture 14, close to each other. In the cross-section, first electrode 16 has three parts: one between the apertures 14 of the units and parts on either side. Each unit comprises a second electrode 60 and a dielectric layer 18 on its second electrode 60. Although two units are shown, it should be appreciated that instead one unit or more than two units, each with a corresponding aperture may be used.

Each solid dielectric layer 18 structure may be manufactured from a first and second ceramic plate placed on opposite sides of the central second electrode plate 60 of the unit. Central second electrode plate 60 may be a thick film electrode. The ceramic plates may be co-fired after assembly with the interior thick film electrode. In an embodiment each plate-structure has a width of about 1 mm, leaving gas flow paths between the plate structures.

In further versions of each of the previous embodiments, a series of apertures may be used instead of one long aperture, and the second electrode may be split into independently controllable parts at positions of respective ones of the apertures. Thus apertures at successive positions along the z-direction may be realized that can be made to produce plasma or not independent of one another. In this way a patterned surface treatment may be realized.

Where the term dielectric layer has been used, it should be appreciated that this layer need not have the same thickness everywhere.

Although embodiments have been described wherein gas is supplied from two sides to the aperture through plasma initiation spaces, like the planar spaces of FIG. 2 it should be appreciated that alternatively gas may be supplied from one side and pumped off along the other side. In this embodiment the latter side need not provide for plasma generation.

Although embodiments have been described wherein gas from the aperture is used to create a gas bearing between the outer surface of the first electrode and the substrate, it should be appreciated that such a gas bearing is not always necessary. It is very useful if the substrate is a flexible foil, but when a rigid substrate is used (i.e. a substrate that does not deform to an extent that the distance to the outer surface can vary significantly, e.g. more than twenty percent) another way of maintaining a distance between the outer surface and the substrate may be used, such as contact spacers adjacent to ends of the aperture.

The invention claimed is:
1. A plasma source, comprising:
an outer surface, interrupted by an aperture for delivering an atmospheric plasma from the outer surface;
a first electrode having a first and second surface extending from an edge of the first electrode that runs along the aperture, the first surface defining the outer surface on a first side of the aperture, the distance between the first and second surface increasing with distance from the edge;
a second electrode at a fixed position relative to the first electrode and a dielectric layer covering at least part of the second electrode, at least part of a surface of the dielectric layer facing the second surface of the first electrode, substantially in parallel with the second surface of the first electrode, leaving a plasma initiation space on said first side of the aperture, between the surface of the dielectric layer and the second surface of the first electrode;
a gas inlet in communication with the plasma initiation space to provide gas flow from the gas inlet to the aperture through the plasma initiation space, wherein:
the first electrode comprises a first and second portion on opposite sides of the aperture respectively, the first and second surface being surfaces of the first portion,
the second portion having a third and fourth surface extending from a second side of the aperture opposite the first side, the third surface defining the outer surface on the second side of the aperture, the distance between the third and fourth surface increasing with distance from an edge of the second portion along the second side of the aperture,
a further part of the dielectric layer facing the fourth surface, substantially in parallel with the fourth surface, leaving a further plasma initiation space on said second side of the aperture, between the surface of the dielectric layer and the fourth surface;
a further gas inlet in communication with the further plasma initiation space to provide gas flow from the further gas inlet to the aperture through the further plasma initiation space;
first ridges between the second surface of the first electrode and the surface of the dielectric layer, running through the plasma initiation space leaving openings between the first ridges for the gas flow towards the aperture; and
second ridges between the fourth surface and the surface of the dielectric layer, running through the further plasma initiation space leaving openings between the second ridges for the gas flow towards the aperture, positions of projections of the first ridges on to the first side of the aperture lying between positions of projections of the second ridges on to the second side of the aperture;

wherein substantially no space remains for gas flow between the first electrode and the dielectric layer at contact surfaces where the first and second ridges are formed.

2. A plasma source according to claim 1, further comprising a transport mechanism configured to transport a substrate and the plasma source relative to each other parallel to the outer surface, with a surface to be processed of the substrate in parallel with at least a part of the outer surface that contains the aperture, wherein the transport mechanism is configured to position a surface of the substrate that faces the outer surface of the plasma source at a distance of at most half a millimeter from each other.

3. A plasma source according to claim 1, wherein the first ridges or the second ridges define openings between pairs of adjacent ridges formed on a same surface, each of the openings allowing a respective part of the gas flow to flow from the gas inlet towards the edge of the first electrode, the respective parts flowing in parallel with each other through the plasma initiation space.

4. A plasma source according to claim 1, wherein a width of the aperture is smaller than five times a distance from the dielectric layer at the aperture to a virtual extension of the outer surface through the aperture.

5. A plasma source according to claim 1, wherein the second electrode has at least a surface part that extends in parallel to the second surface of the first electrode, the plasma initiation space lying between said surface part of the second electrode and the second surface of the first electrode, said at least part of a surface of the dielectric layer lying on said surface part of the second electrode between the second electrode and the plasma initiation space.

6. A plasma source according to claim 1, wherein the first ridges run in parallel in a direction from the gas inlet towards the first side of the aperture and the second ridges run in parallel in a direction from the further gas inlet towards the second side of the aperture, the positions of projections of the first ridges on to the first side of the aperture lying midway between the positions of projections of the second ridges on to the first side of the aperture.

7. A plasma source according to claim 1, wherein the first ridges and the second ridges end short of the edges of the first and second portion at the first and second side of the aperture.

8. A plasma source according to claim 1, wherein the aperture has a width between the first and second side of the aperture of between one and five millimeter.

9. A plasma source according to claim 1, further comprising a transport mechanism configured to transport a substrate and the plasma source relative to each other parallel to the outer surface, with a surface to be processed of the substrate in parallel with at least a part of the outer surface that contains the aperture, wherein the transport mechanism is configured to transport the substrate and the plasma source relative to each other using the gas flow as a gas bearing to keep the substrate and the outer surface apart adjacent the aperture once the gas flow has emerged from the aperture.

10. A plasma source according to claim 1, further comprising a transport mechanism configured to transport a substrate and the plasma source relative to each other parallel to the outer surface, with a surface to be processed of the substrate in parallel with at least a part of the outer surface that contains the aperture, wherein the transport mechanism comprises one of a conveyor belt for transporting the substrate, a table and a motor configured to drive the table, and a roll to roll mechanism.

11. A plasma source according to claim 1, wherein each of the first ridges has an endpoint proximate the aperture and running through the plasma initiation space, and each of the second ridges has an endpoint proximate the aperture and running through the further plasma initiation space, wherein a distance from the aperture to positions along a longest direction of the ridge increases with distance from the endpoint to the positions.

12. The plasma source according to claim 1, wherein the first ridges and/or the second ridges have a width that diminishes with decreasing distance to the aperture.

13. The plasma source according to claim 1, wherein the first and second ridges are formed of dielectric material, and the first and second ridges are configured with a height that forms contact surfaces between the first ridges and the second surface and between the second ridges and the fourth surface of the first electrode, such that substantially no space remains for gas to flow through the contact surfaces of the first and second dielectric and/or conductive ridges.

14. The plasma source according to claim 1, wherein the first and second ridges are formed of electrically conductive material, and the first and second ridges are configured with a height that forms contact surfaces between the first and second ridges and the dielectric layer, such that substantially no space remains for gas to flow through the contact surfaces of the first and second dielectric and/or conductive ridges.

15. The plasma source according to claim 1, wherein at least a subset of the first and second ridges comprise an electrically conductive ridge part formed on the second surface and fourth surface of the first electrode and a dielectric ridge part formed on the dielectric layer, and the first and second ridges are configured with a height that forms contact surfaces between the first and second ridges formed on opposing surfaces of the dielectric layer and the second surface and fourth surface of the first electrode, such that substantially no space remains for gas to flow through the contact surfaces of the first and second ridges.

* * * * *